(12) United States Patent
Yamada et al.

(10) Patent No.: US 9,009,973 B2
(45) Date of Patent: Apr. 21, 2015

(54) METHOD OF MANUFACTURING LIQUID DISCHARGING HEAD

(75) Inventors: Takahiro Yamada, Ibaraki (JP); Tomohiko Koda, Ibaraki (JP); Hitoshi Kida, Ibaraki (JP)

(73) Assignee: Ricoh Company, Ltd., Tokyo (JP)

( * ) Notice: Subject to any disclaimer, the term of this patent is extended or adjusted under 35 U.S.C. 154(b) by 1161 days.

(21) Appl. No.: 12/949,972

(22) Filed: Nov. 19, 2010

(65) Prior Publication Data

US 2011/0061216 A1 Mar. 17, 2011

Related U.S. Application Data

(62) Division of application No. 12/213,457, filed on Jun. 19, 2008, now Pat. No. 8,087,761.

(30) Foreign Application Priority Data

Jun. 20, 2007 (JP) ................. P2007-162704

(51) Int. Cl.
*B41J 2/16* (2006.01)
*H01L 41/257* (2013.01)
(Continued)

(52) U.S. Cl.
CPC ............... *B41J 2/1612* (2013.01); *B41J 2/162* (2013.01); *B41J 2/161* (2013.01); *B41J 2/14201* (2013.01); *B41J 2/14209* (2013.01); *B41J 2/14233* (2013.01); *H01L 41/083* (2013.01); *H01L 41/257* (2013.01); *B41J 2/04506* (2013.01);
(Continued)

(58) Field of Classification Search
CPC .......... B41J 2/1612; B41J 2/161; B41J 2/162; B41J 2/14201; B41J 2/14209; B41J 2/14233; B41J 2/14274; H01L 41/083; H01L 41/257

USPC ............ 29/25.35, 890.1, 830, 854, 593; 347/68–72
See application file for complete search history.

(56) References Cited

U.S. PATENT DOCUMENTS 4,704,675 A 11/1987 Jacobs et al.
5,923,352 A 7/1999 Kikuchi et al.
(Continued)

FOREIGN PATENT DOCUMENTS

GB 2 433 230 A 6/2007
GB 2 445 117 A 6/2008
(Continued)

OTHER PUBLICATIONS

United States Office Action dated Jan. 20, 2011 in U.S. Appl. No. 12/213,457.
(Continued)

*Primary Examiner* — A. Dexter Tugbang
(74) *Attorney, Agent, or Firm* — McGinn IP Law Group, PLLC (57) ABSTRACT

A method for manufacturing a liquid discharging head, the method including forming a plurality of nozzles that discharge liquid droplets, forming a plurality of piezoelectric elements that generate pressure for discharging liquid droplets from the respective nozzles; and performing a repolarization process on the piezoelectric elements to set non-uniformity of the droplet discharging characteristics of the nozzles to be in a predetermined range by combining adjustment of a polarization sensitivity and adjustment of a polarization voltage for each of the piezoelectric elements.

16 Claims, 8 Drawing Sheets

(51) Int. Cl.
*H01L 41/083* (2006.01)
*B41J 2/045* (2006.01)
*B41J 2/14* (2006.01)

(52) U.S. Cl.
CPC ............ *B41J 2/0456* (2013.01); *B41J 2/04581* (2013.01); *B41J 2/14274* (2013.01)

(56) References Cited

U.S. PATENT DOCUMENTS

| | | | |
|---|---|---|---|
| 6,356,008 B1 * | 3/2002 | Nakajima | 29/25.35 |
| 7,134,746 B2 * | 11/2006 | Takahashi | 347/72 |
| 2006/0268072 A1 | 11/2006 | Yamada et al. | |
| 2007/0132813 A1 | 6/2007 | Yamada et al. | |
| 2008/0098582 A1 | 5/2008 | Ohnishi et al. | |
| 2008/0111453 A1 | 5/2008 | Yoshioka et al. | |

FOREIGN PATENT DOCUMENTS

| | | | |
|---|---|---|---|
| JP | 61-158470 A | | 7/1986 |
| JP | 63-260454 A | | 10/1988 |
| JP | 4-151253 A | | 5/1992 |
| JP | 5-160464 A | | 6/1993 |
| JP | 5-243884 A | | 9/1993 |
| JP | 9-141859 A | | 6/1997 |
| JP | 10226080 A | * | 8/1998 |
| JP | 11-147312 A | | 6/1999 |
| JP | 2001-277525 A | | 10/2001 |
| JP | 2006-315326 A | | 11/2006 |
| JP | 2006315326 A | * | 11/2006 |
| JP | 2007-160701 A | | 6/2007 |
| WO | WO 2007/001063 A1 | | 1/2007 |

OTHER PUBLICATIONS

Notification of Reason(s) for Refusal dated on Dec. 20, 2011, with English translation.

United Kingdom Search Report dated Sep. 30, 2008.

* cited by examiner

METHOD OF MANUFACTURING LIQUID DISCHARGING HEAD

RELATED APPLICATIONS

The present Application is a Divisional Application of U.S. patent application Ser. No. 12/213,457, which was filed on Jun. 19, 2008, now U.S. Pat. No. 8,087,761 B2, the disclosure of which is incorporated herein by reference.

The present disclosure relates to the subject matter contained in Japanese Patent Application No. 2007-162704 filed on Jun. 20, 2007, which is incorporated herein by reference in its entirety.

FIELD

The present invention relates to a liquid discharging head, a method of manufacturing the liquid discharging head, and an image forming apparatus that is provided with the liquid discharging head, the liquid discharging head being provided with a piezoelectric element.

BACKGROUND

Conventionally, as an image forming apparatus, such as a printer, a copier, an image transmitting/receiving apparatus, and a multi-function apparatus that is provided with functions of such apparatuses, there is an apparatus that have a print head configured provided with a liquid discharging head for discharging ink droplets of recording liquid (hereinafter, referred to as ink) in a liquid form and performs an image forming (i.e. recording, printing, imaging, or typing) process by attaching ink to a medium (hereinafter, the medium is also referred to as a sheet, the material thereof is not limited thereto, and a recorded medium, a transfer sheet, a recording sheet, or the like means the same) while conveying the medium.

In the following description, the image forming apparatus means an apparatus that discharges liquid onto a medium such as paper, thread, textiles, cloth, leather, metal, plastic, glass, wood, or ceramics. In addition, "image forming" means not only providing an image having a meaning such as a text or a diagram to a medium but also providing a meaningless image such as a pattern to a medium (broadly meaning: the image forming apparatus means the same as a liquid discharging apparatus in the meaning of an apparatus that discharges liquid droplets).

As a liquid discharging head, a piezoelectric type ink-jet print head is known, which uses a so-called piezoelectric actuator which has a piezoelectric element as a pressure generator for generating pressure to press ink inside a liquid chamber that is connected with nozzles used for discharging liquid droplets and changes the volume/pressure inside the liquid chamber so as to discharge the liquid droplets by transforming an elastically-transformable member (diaphragm) forming one side of the liquid chamber.

In a multi-nozzle ON-Demand type ink-jet print head that is provided with a number of nozzles, it is important to decrease non-uniformity of discharging speeds and masses of ink droplets in each of the nozzles for performing a recording process to obtain a high-quality image at high to speed with high reliability.

The ON-Demand type ink-jet print head uses a push-type piezoelectric element in which the wall of an ink pressing chamber having a nozzle opening is configured by a diaphragm, the diaphragm is pressed by vertical vibration of a rod-shaped piezoelectric element, and ink droplets are discharged by increasing the pressure of the ink inside the ink pressing chamber. In the ON-Demand type ink-jet print head, a plan for increasing precision of the piezoelectric element and components constituting the ink pressing chamber, and improving the assembly precision for bonding the components has been performed.

However, there is a case where such a plan is accompanied by a problem such as an increase of costs of the components or an increase of the assembly time.

Accordingly, as a method for appropriately adjusting the polarization state of the piezoelectric element, a so-called polarization correcting method for correcting the non-uniformity of the droplet discharging speeds or droplet masses among the nozzles to be decreased has been known. As a method of appropriately adjusting the polarization state of the piezoelectric element, it is known that a method in which a polarization voltage applied to a piezoelectric element of a nozzle discharging high-speed droplets is adjusted and set to be lower than that of a nozzle discharging low-speed droplets is simple and convenient. An example of such method is disclosed in JP-A-2001-277525.

By using this method, an ink-jet print head is obtained by not requiring an additional part, circuit, or the like, of which non-uniformity of discharging speeds or masses of the ink droplets is improved at high precision in an easy manner by only adding adjustment costs in the manufacturing process of the head.

However, in a polarization correcting method, as described in the document JP-A-2001-277525, in which the polarization states of the piezoelectric elements are corrected by adjusting the polarization voltages in accordance with the ink droplet discharging speeds of the entire nozzles, for a print head of which non-uniformity of ink droplet discharging speeds is high, the amount of adjustment of the polarization voltages needs to be large, and accordingly there is a case where the polarization voltage becomes too low.

When the polarization voltage is too low, the piezoelectric elements are polarized by driving voltages applied to the piezoelectric elements for discharging ink droplets, the result of adjustment of the degree of polarization becomes unsuccessful in accompaniment with elapse of a driving time for discharging ink droplets, and thereby the irregularity of discharging speeds among the nozzles becomes high. Accordingly, it has been determined that there is a problem that a correction process having usable endurance cannot be performed for a print head having high non-uniformity of ink droplet discharging speeds. In addition, this problem occurs in the same manner by performing a correction process for the non-uniformity of the ink droplet masses.

SUMMARY

One of objects of the present invention is to provide a liquid discharging head capable of stably discharging droplets while having low non-uniformity of the droplet discharging characteristics without incurring a failure of adjustment of the degree of polarization due to a droplet discharge operation, a method of manufacturing the above-described liquid discharging head, and an image forming apparatus capable of stably forming a high-quality image.

According to a first aspect of the invention, there is provided a liquid discharging head including: a plurality of nozzles that discharge liquid droplets; and a plurality of piezoelectric elements that generate pressure for discharging liquid droplets from the respective nozzles, wherein the piezoelectric elements are performed with repolarization process to set non-uniformity of the droplet discharging characteristics of the nozzles to be in a predetermined range by combining adjustment of a polarization sensitivity and adjustment of a polarization voltage for each of the piezoelectric elements.

According to a second aspect of the invention, there is provided a method for manufacturing a liquid discharging head, the method including: forming a plurality of nozzles that discharge liquid droplets; forming a plurality of piezoelectric elements that generate pressure for discharging liquid droplets from the respective nozzles; and performing a repolarization process on the piezoelectric elements to set non-uniformity of the droplet discharging characteristics of the nozzles to be in a predetermined range by combining adjustment of a polarization sensitivity and adjustment of a polarization voltage for each of the piezoelectric elements.

According to a third aspect of the invention, there is provided an image forming apparatus including: a recording medium conveyance mechanism that conveys a recording medium; and a liquid discharging head that includes: a plurality of nozzles that discharge liquid droplets onto the recording medium; and a plurality of piezoelectric elements that generate pressure for discharging liquid droplets from the respective nozzles, wherein the piezoelectric elements are performed with repolarization process to set non-uniformity of the droplet discharging characteristics of the nozzles to be in a predetermined range by combining adjustment of a polarization sensitivity and adjustment of a polarization voltage for each of the piezoelectric elements.

DETAILED DESCRIPTION OF THE EMBODIMENTS

Figure 1:
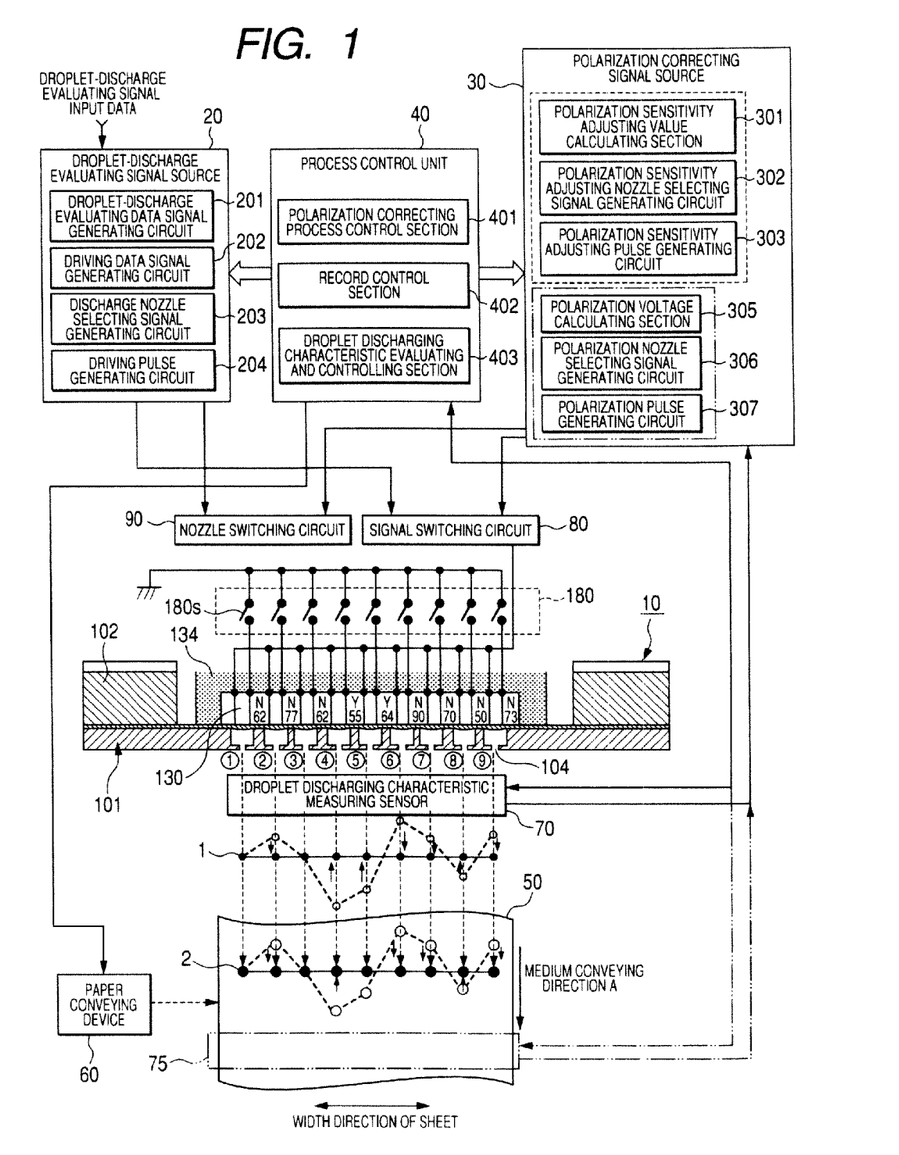
FIG. 1 is a diagram showing a head manufacturing apparatus in which a print head as a liquid discharging head according to an embodiment of the present invention and a method of manufacturing a liquid discharging head according to an embodiment of the invention is used.

Hereinafter, embodiments of the present invention will be described with reference to the accompanying drawings. FIG. 1 is a diagram showing a head manufacturing apparatus in which a liquid discharging head according to an embodiment of the present invention and a method of manufacturing a liquid discharging head according to an embodiment of the invention are used.

The head manufacturing apparatus that manufactures a print head 10, as a liquid discharging head, includes a droplet-discharge evaluating signal source (droplet discharging characteristic evaluating signal generating unit) 20 that generates a driving signal used for driving the print head 10 in accordance with droplet discharging characteristic evaluating data for evaluating the ink-droplet discharging characteristics of the print head 10, a polarization correcting signal source (polarization correcting signal generating unit) 30 that generates and outputs a polarization correcting signal used for the polarization correction of the print head 10, a process control device (control unit) 40 that is responsible for control of the whole head manufacturing apparatus, a droplet discharging characteristic measuring sensor 70 that measures the discharge characteristic of ink droplets discharged from the print head 10, and the like. In addition, since the head manufacturing apparatus is used for measuring the droplet discharging characteristic by discharging liquid droplets from the print head 10, head manufacturing apparatus includes a recording sheet 50 disposed to face the front side of the print head 10 and a recording sheet conveying device (unit) 60 that relatively moves the recording sheet 50 with respect to the print head 10 at high speed in a medium conveying direction (the direction of arrow A shown in FIG. 1).

In FIG. 1, although a case where nine nozzles are disposed in the print head 10 is shown as an example for the purpose of a description, many nozzles of several tens to several thousands are included in a print head practically in use.

Figure 2:
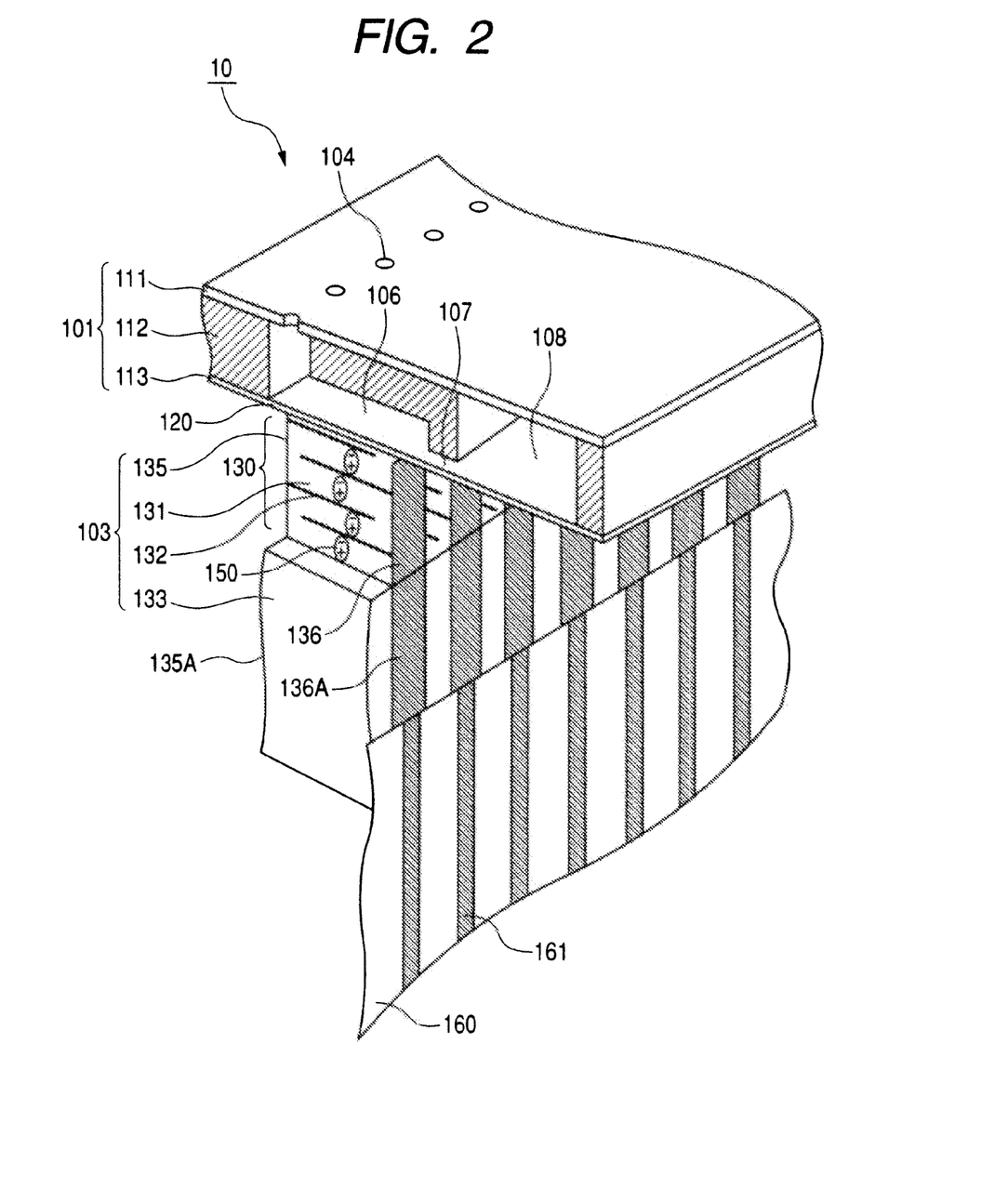
FIG. 2 is a partially enlarged perspective view of an example of the print head shown in FIG. 1.

Here, an example of the print head 10 will be described with reference to FIG. 2. FIG. 2 is a perspective view of a cross-section of major components of the liquid discharging head configuring the print head 10.

The head 10 is configured by a flow path unit 101, a head housing 102 (see FIG. 1) that maintains the flow path unit 101, and a piezoelectric element unit 103 that is a piezoelectric actuator.

The flow path unit 101, as shown in FIG. 2, is configured by sequentially laminating an orifice plate (nozzle plate) 111, a flow path forming plate 112, and a diaphragm forming plate 113. In the orifice plate 111, n nozzles (nozzle openings) 104 are formed to be aligned with a predetermined pitch. In the flow path forming plate 112, a pressure chamber 106 that communicates with the nozzles 104, an inflow opening 107 that leads ink to the pressure chamber 106, a concave part that forms a common liquid chamber 108 for supplying the ink to each pressure chamber 106 through the inflow path 107, and a through hole are formed. The diaphragm forming plate 113 has a diaphragm part 120 that forms one side of the pressure chamber 106 and can be transformed.

The piezoelectric element unit 103 is configured by attaching the lamination-type piezoelectric element 130 having a rod shape to a piezoelectric supporting substrate 133 with an adhesive agent or the like in a comb-tooth shape. To a side opposite to the pressure chamber 106 of the diaphragm part 120, one end of the rod-shaped piezoelectric element 130 of the piezoelectric element unit 103 is attached. Here, the front end portion of the rod-shaped piezoelectric element 130 is brought into contact with the diaphragm part 120 so as to be fixed to the diaphragm part 120 through an adhesive agent layer. In addition, on both sides of the piezoelectric element supporting substrate 133 in the direction of alignment of the piezoelectric elements, a columnar-shaped piezoelectric element supporting substrate fixing part 134 is disposed. The bottom side of the piezoelectric element supporting substrate fixing part 134 is fixed to the flow path unit 101 with an adhesive agent or the like.

The flow path unit 101 is bonded to be fixed to the head housing 102 near the bonding and fixing part. Accordingly, the bottom side of the piezoelectric element supporting substrate fixing part 134 is fixed to the head housing 102.

The rod-shaped piezoelectric element 130, as shown in FIG. 2, has a laminated structure, and a plurality of layered piezoelectric elements 131 is laminated through a layered electrode 132. The layered electrode 132 is electrically connected to a common electrode 135 and an individual electrode 136, which are formed on a side of the rod-shaped piezoelectric element 130, alternately. The common electrode 135 and the individual electrode 136 are connected to a common electrode 135A and an individual electrode 136A that are formed on the surface of the piezoelectric element supporting substrate 133, and are connected to a flexible cable terminal 161 of a flexible cable 160.

Here, the layered piezoelectric elements 131 of the rod-shaped piezoelectric element 130 have remaining polarization 150. The remaining polarization 150 is formed by applying a polarization voltage between the common electrode 135 and the individual electrode 136. The magnitude of the remaining polarization 150 can be adjusted by changing the degree of polarization of the piezoelectric element by changing polarization conditions such as the magnitude of the polarization voltage or a temperature condition for polarization. In this embodiment, as a method that can be performed in a simple manner, a method in which the degree of the polarization is adjusted by maintaining the temperature for the polarization at normal temperature and changing the polarization voltage is used.

With reference back to FIG. 1, the individual electrode 136 of the print head 10 configured as described above is grounded by the flexible cable 160 through a switching element 180. In addition, the common electrode 135 is connected to the droplet-discharge evaluating signal source 20 or the polarization correcting signal source 30 though a signal switching circuit 80.

In front of the nozzle opening of the print head 10, a droplet discharging characteristic measuring sensor 70 that measures the discharge speed and the volume of an ink droplet 1 discharged from each nozzle 104 opening is disposed. The droplet discharging characteristic measuring sensor 70 is configured by a CCD sensor array that associates one pixel or more CCD sensor elements with each nozzle 104 or the like. An ink droplet image is formed in each light receiving part of the CCD sensor array, and the discharge speed and the droplet mass (droplet volume) are measured by using known technology for measuring the time or amplitude of the output signal of the sensor, measuring the number of sensed pixels, or the like.

As the droplet discharging characteristic measuring sensor 70, a sensor of a type in which a laser beam and a light receiving element are disposed to face each other and an ink droplet passing between the laser beam and the light receiving element is read by the light receiving element can be used. When ink droplets discharged from only a part of nozzles 104 of the print head 10 can be simultaneously read and measured, the ink droplets may be sequentially measured by scanning a read device along the nozzle array (in which a plurality of the nozzles 104 is aligned) for measuring the entire nozzles.

The droplet discharging speed and the droplet mass may be measured by disposing a recorded-dot state reading sensor 75 that reads out a recorded dot 2 formed on the recording medium 50. For example, a line of recorded dots 2 is recorded on the recording sheet 50, and the recorded dots 2 are read out by the recorded-dot state reading sensor 75, and thereby deviations of recorded dot positions from reference record positions are measured. When the droplet discharging speed of the liquid droplets is high, liquid dots land on the downstream side of the recording sheet 50 relative to the reference record position to form the recorded dots 2. ON the other hand, when the droplet discharging speed of the liquid droplets is low, the liquid dots land on the upstream side of the recording sheet relative to the reference record position to form the recorded dots 2. Accordingly, the droplet discharging speed of the liquid droplets is measured by measuring the amount of deviation from the reference record position. In addition, the volume (the droplet mass) of the liquid droplets can be measured by reading the size of the recorded dots 2 and the density of recording.

Each unit such as the droplet-discharge evaluating signal source 20, the polarization correcting signal source 30, the signal switching circuit 80, a nozzle switching circuit 90, the sheet conveying device 60, the droplet-discharge characteristic measuring sensor 70, or the like is connected to the process control device 40, and is controlled by the process control device 40.

The droplet-discharge evaluating signal source 20 has a droplet-discharge evaluating data signal generating circuit 201 that generates an ink droplet-discharge evaluating data signal, a driving data signal generating circuit 202 that generates driving data for driving the piezoelectric element 130 of the print head 10, an discharge-nozzle selecting signal generating circuit 203 that generates an discharge-nozzle selecting signal for selecting a piezoelectric element corresponding to a nozzle discharging ink droplets, and a driving pulse generating circuit 204 that generates a driving pulse for driving the piezoelectric element 130. As the waveform of the driving pulse, a trapezoidal waveform or the like can be used.

The polarization correcting signal source 30 has a polarization sensitivity adjusting value calculating section 301 that calculates a polarization sensitivity adjusting value for generating a signal for adjusting the polarization sensitivity of the piezoelectric element 130 corresponding to each nozzle 104, a polarization sensitivity adjusting nozzle selecting signal generating circuit 302 that generates a signal (polarization sensitivity adjusting nozzle selecting signal) for driving the nozzle switching circuit 90 so as to select a nozzle 104 to which a signal (polarization sensitivity adjusting signal) for adjusting the polarization sensitivity of the piezoelectric element 130 is applied, and a polarization sensitivity adjusting pulse generating circuit 303 that generates a polarization sensitivity adjusting signal (pulse) to be applied to the piezoelectric element 130 of the selected nozzle 104.

In addition, the polarization correcting signal source 30 has a polarization voltage calculating section 305 that calculates a polarization voltage so as to generate a signal for polarizing the piezoelectric element 130 of each nozzle 104, a polarization nozzle selecting signal generating circuit 306 that generates a signal (polarization nozzle selecting signal) for driving the nozzle switching circuit 90 so as to select a nozzle to which the polarization voltage signal is applied, and a polarization pulse generating circuit 307 that generates a polarization signal (polarization pulse) to be applied to the piezoelectric element 130 of the selected nozzle 104. Here, as the waveform of the polarization sensitivity adjusting pulse, an AC waveform or the like can be used. In addition, as the waveform of the polarization pulse, a trapezoidal waveform or the like can be used.

The process control device 40 has a polarization correcting process control unit 41 that performs control of a polarization correcting process, a record control unit 42 that controls discharge of liquid droplets from the print head 10, and a droplet discharging characteristic evaluating and controlling section 403 that performs control of the polarization correcting signal source 30 and evaluation of the polarization correcting process.

The droplet-discharge evaluating signal source 20, the polarization correcting signal source 30, and the process control device 40 are not needed to be implemented as independent hardware, and may be configured by sharing resources such as a CPU and a memory of a computer system.

Next, an operation for evaluating the ink droplet discharging characteristic of the print head in the head manufacturing device configured as described above will be described.

First, input data for an ink droplet discharging characteristic evaluating signal from a higher level apparatus (for example, a personal computer), not shown in the figure, is input to the droplet-discharge evaluating signal source 20, a data signal for evaluating droplet discharge is generated in accordance with the input by the droplet-discharge evaluating data signal generating circuit 201, and a driving data signal is generated in accordance with reception of the data signal by the driving data signal generating circuit 202. Then, a discharging nozzle selecting signal is generated in accordance with reception of the driving data signal by the discharging nozzle selecting signal generating circuit 203.

Then, the discharging nozzle selecting signal from the discharging nozzle selecting signal generating circuit 203 is transmitted to the nozzle switching circuit 90. Then a desired switching element 180s constituting a switching element array 180 of the nozzle switching circuit 90 is controlled to be ON/OFF with respect to the ground in accordance with the discharging nozzle selecting signal.

Since the signal switching circuit 80 is switched to the driving pulse generating circuit 204 side in a droplet discharging characteristic evaluating process, the driving pulse generated by the driving pulse generating circuit 204 is applied to the common electrode 135 of the piezoelectric element 130 of the print head 10 through the signal switching circuit 80.

Accordingly, a driving pulse is applied to the piezoelectric element 130 corresponding to the ON-state switching element 180s of the switching element array 180 to be driven. Then, the volume of the pressure chamber 106 changes through the diaphragm 120 by the driven piezoelectric element 130, and thereby ink droplets 1 are discharged from the nozzle 104.

The droplet discharging characteristic measuring sensor 70 is controlled by the process control unit 40, and the droplet discharging speed and the droplet mass of the droplets 1 discharged from each nozzle 104 of the print head 10 are measured. The result of the measurement is transmitted to the polarization correcting signal source 30.

When the droplet discharging characteristic is to be evaluated based on the record state, the recorded dots 2 are formed by landing the discharged ink droplets 1 in the recording sheet 50 that moves in the direction of arrow A shown in FIG. 1. By performing the above-described record operation, an image composed of a set of the recorded dots 2 is formed on the recording sheet 50. Then, the characteristic of the droplet discharging speed is evaluated based on information on the positions of the recorded dots in the image, and the characteristic of the droplet mass is evaluated based on the sizes and densities of the recorded dots 2.

Next, the polarization processing operation for the piezoelectric element 130 of the print head 1 will be described. In the process of the polarization sensitivity adjustment and polarization of the piezoelectric element 130, the polarization correcting signal source 30 is driven, and each switching element 180s of the switching element array 180 is controlled to be turned ON/OFF in accordance with a selection signal transmitted from the polarization sensitivity adjusting nozzle selecting signal generating circuit 302 or the polarizing nozzle selecting signal generating circuit 306 through the nozzle switching circuit 80. A switching element 180s connected to the individual electrode 136 of the piezoelectric element 130 to be polarized is turned ON and is grounded. Since the common electrode 135 of the piezoelectric element 130 is connected to the polarization sensitivity adjusting pulse generating circuit 303 and the polarization pulse generating circuit 307, to the piezoelectric element 130 connected to the switching element 180s that in the ON state, a polarization sensitivity adjusting pulse or the polarization pulse is applied. Accordingly, adjustment of the polarization sensitivity and adjustment of the polarization voltage are performed for the piezoelectric element 130.

In such a case, in a diagram shown FIG. 1, dotted lines extending in the downward direction of each nozzle 104 are flight trajectories of the ink droplets 1. The position of the ink droplet 1 marked as a circle located in the front end of an arrow in each dotted line represents a flight position of an ink droplet 1 at a time when a predetermined to time elapses after the ink droplet 1 is discharged from the nozzle 104 by applying the driving signal voltage (driving pulse) to the piezoelectric element 130. A white circle is a flight position before a repolarization process according to an embodiment of the present invention is performed (hereinafter, referred to as "before the present invention is performed"), and a black circle is a flight position after an embodiment of the present invention is performed. The notation of the black circle only represents that the flight positions before and after the present invention is performed are the same. In addition, dotted lines connecting the white circles are reference lines for clearly showing the non-uniform state of the flight positions before the present invention is performed, and solid lines are reference lines after the present invention is performed.

In FIGS. 4A-4D, a nozzle number (a number for each nozzle 104, the numbers are, hereinafter, represented as a 1st nozzle, a 2nd nozzle . . . , a 9th nozzle from the left side in FIG. 1, and are denoted by circled numbers in FIG. 1) is taken in the horizontal axis, and the droplet discharging speed is taken in the vertical axis. FIGS. 4A-4D show an example of the characteristic of non-uniformity of droplet discharging speeds among the nozzles in a case where the driving voltage of the piezoelectric element corresponding to each nozzle 104 is 25V. The nozzle number corresponds to each nozzle 104 of the print head 10 shown in FIG. 1. A dotted line connecting the plots of droplet discharging speed data of the nozzles 104 having the nozzle numbers 1 to 9 in the horizontal direction, represented in graphs of FIGS. 4A-4D is a reference line for clearly showing the non-uniform state of discharge among the nozzles before the present invention is performed. In addition, a solid line corresponding to the dotted line is a reference line after the present invention is performed.

Figure 4A:
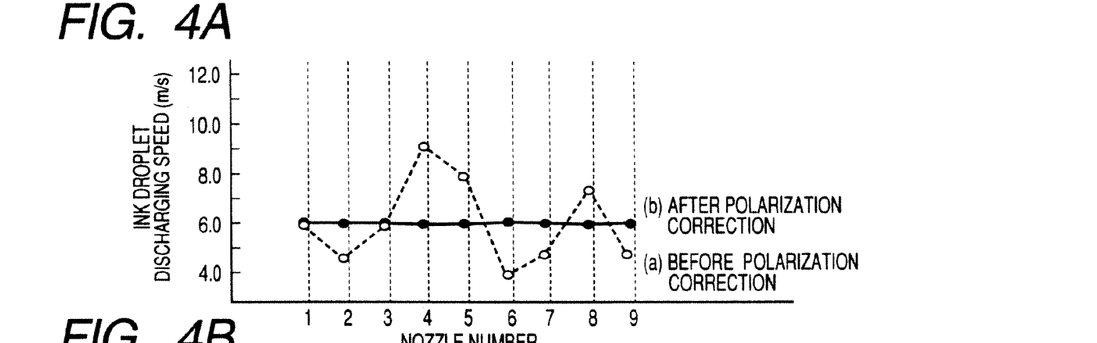
FIGS. 4A-4D are diagrams showing a detailed example of the polarization correcting operation.
Figure 4B:
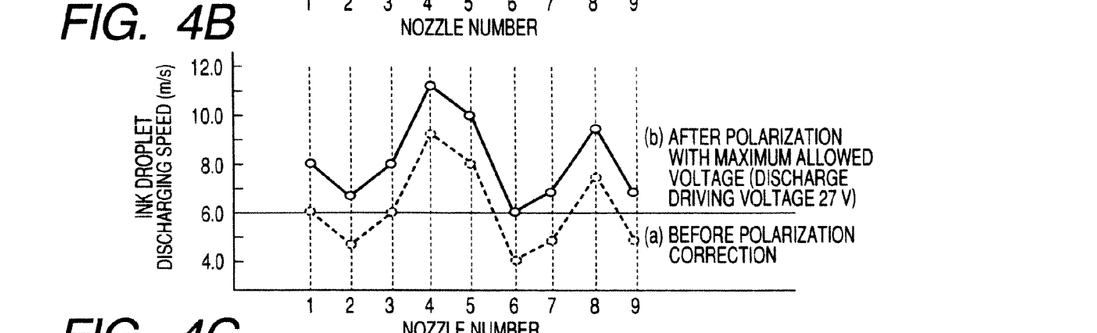

As can be known from the graph shown in FIG. 4A, the droplet discharging speeds among the nozzles of the print head 10 before performance of the present invention are non-uniform in an approximate width of 4 to 9 m/s having the center near 6 m/s. The non-uniformity of the droplet discharging speeds causes the landing positions in the recording sheet 50 to be non-uniform, and thereby the recording quality of the recording apparatus (image forming apparatus) is deteriorated. The droplet discharging speeds of the 1st nozzle and the 3rd nozzle have an almost same value of about 6 m/s. Accordingly, as shown in FIG. 1, the flight positions in the droplet discharging direction are close to each other. On the contrary, the droplet discharging speeds of the 4th, 5th, and 8th nozzles are over 6 m/s, which is higher than those of the 1st and 3rd nozzles. Accordingly, the flight positions of the ink droplets from the 4th, 5th, and 8th nozzles are closer to the recording medium 50 than the flight positions of the ink droplets from the 1st and 3rd nozzles. On the contrary, the droplet discharging speeds of the 2nd, 6th, 7th, and 9th nozzles are lower than 6 m/s. Accordingly, the flight positions of the ink droplets from the 2nd, 6th, 7th, and 9th nozzles are close to the nozzle opening (that is, closer to the print head 10) than those from the 1st and 3rd nozzles.

In a recording process, since the ink droplet 1 landed to be recorded while the recording sheet 50 is moved with respect to the print head 10, the landing position in the recording sheet 50 becomes non-uniform in correspondence with the non-uniform flight positions of the ink droplets shown in FIG. 1, and thereby the quality of the recorded image is deteriorated. Accordingly, in order to acquire the recording quality of the apparatus, it is needed to minimize the non-uniformity of ink-droplet discharging speeds among the nozzles as possibly as can be.

Thus, in the present invention, as described below, a predetermined polarization sensitivity adjusting voltage and a repolarization voltage are appropriately applied to each piezoelectric element 130, and polarization correction is performed at high precision. Accordingly, the droplet discharging speeds of all the nozzles 104 including the 1st to 9th nozzles in the above-described example shown in FIG. 3 are maintained within a non-uniform range, for example, equal to or less than about 6.0±0.2 m/s as represented by (b) in FIG. 4A.

A detailed operation for the repolarization process (polarization correction) according to an embodiment of the present invention will be described with reference to a flowchart shown in FIG. 3, the above-described FIGS. 4A-4D, and a graph of the characteristic of droplet discharging speeds shown in FIG. 5.

Figure 3:
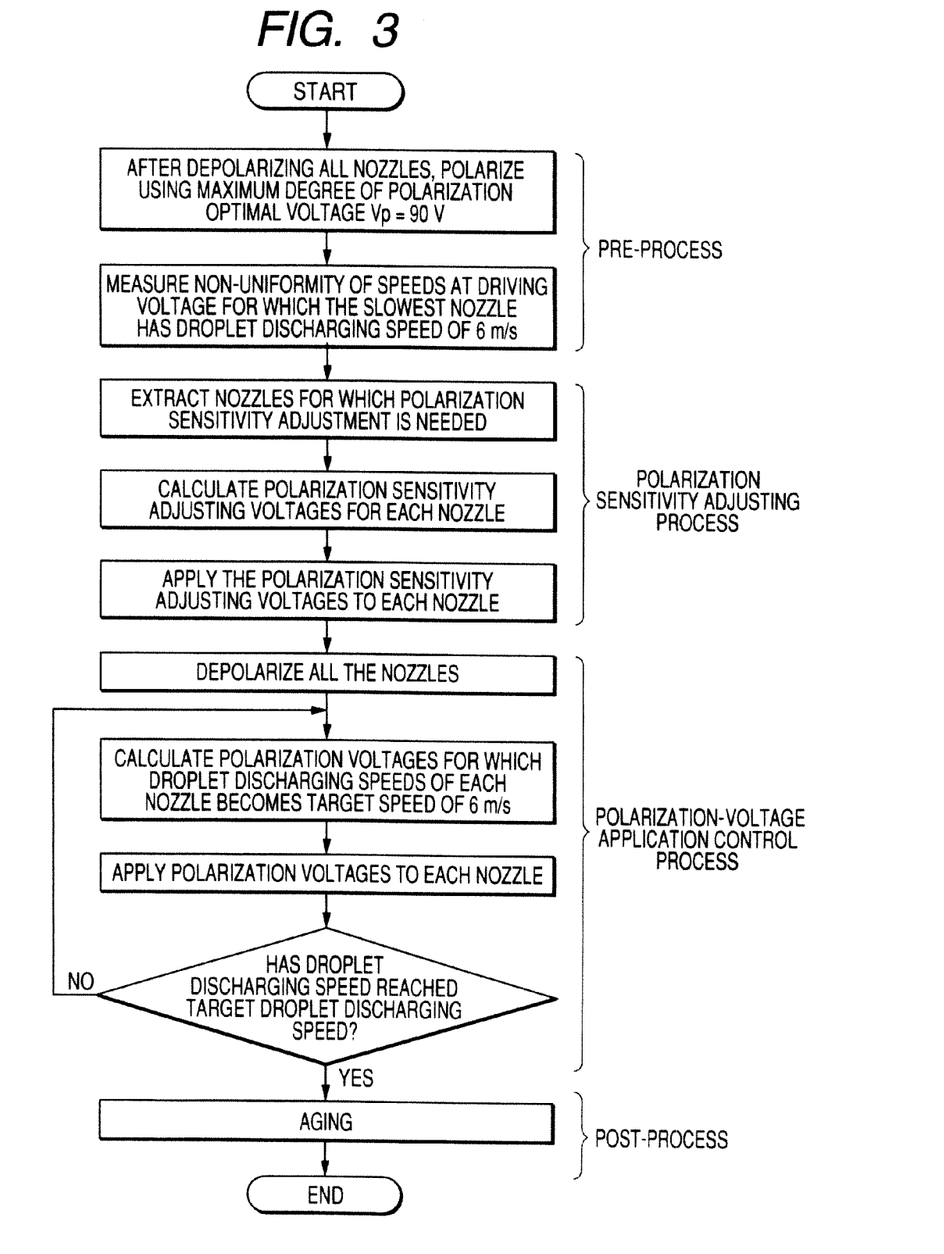
FIG. 3 is a flowchart showing a polarization correcting operation according to a first embodiment of the present invention.

The polarization correction, as shown in FIG. 3, includes a pre-process, a polarization sensitivity adjusting process, a polarization-voltage application adjusting process, and a post-process. A series of the processes is performed by controlling each components such as the droplet-discharge evaluating signal source 20, the polarization signal source 30, or the like, using the process control device 40. In a description below, the entire nozzles including the 1st to 9th nozzles configuring the print head 10 shown in FIG. 1 are nozzles to be corrected. A case where the characteristic of the non-uniform speeds among the nozzles before correction is represented by (a) shown in FIG. 4A will be described as an example.

First, in the pre-process, piezoelectric elements 130 corresponding to all the nozzles are depolarized at once. Thereafter, a highest polarization voltage (highest allowed polarization voltage) that can be applied to the piezoelectric elements 130 by the polarization pulse generating circuit 307, for example, a polarization pulse of 90 V is output, and the piezoelectric elements 130 corresponding to each nozzle are polarized. The highest allowed polarization voltage is determined based on the material and the thickness of the layer of the piezoelectric element 130, and the like.

In the state polarized by using the highest allowed polarization voltage, the piezoelectric elements 130 corresponding to all the nozzles 104 are driven for discharge. Then, a driving voltage, for example, 27 V that enables a nozzle 104 that has the lowest droplet discharging speed, in the example of FIG. 4A, the 6th nozzle to reach a target speed of 6 m/s is set as a reference discharge driving voltage. The characteristic of the non-uniformity of droplet discharging speeds among the 1st to 9th nozzles at this moment is represented by a graph (b) shown in FIG. 4B. Accordingly, by repolarizing the piezoelectric elements 130 of nozzles other than the 6th nozzle using an optimal polarization voltage equal to or lower than 90 V, the non-uniformity of the characteristic of the droplet discharging speed can be reduced. Thereby, the droplet discharging speeds of all the nozzles can be adjusted in the range of the target non-uniformity of speeds (6±0.2 m/s).

However, in a correction process for a nozzle having a droplet discharging speed too far from the target speed, the polarization voltage for correcting the speed to the target speed becomes too low, and the usable endurance for a driving operation on the basis of the droplet-discharge driving signal in a record process disappears. Accordingly, print heads of which polarization can be corrected are limited.

Thus, in this embodiment, a polarization sensitivity adjusting process is performed after the pre-process is performed, so that the polarization sensitivities of the piezoelectric elements are adjusted. In the polarization sensitivity adjusting process, nozzles for which the polarization sensitivity adjustment is needed are extracted, polarization sensitivity adjusting voltage values for the extracted nozzles are calculated, and polarization sensitivity adjusting pulses having the calculated voltage values are applied to the piezoelectric elements.

Figure 4C:
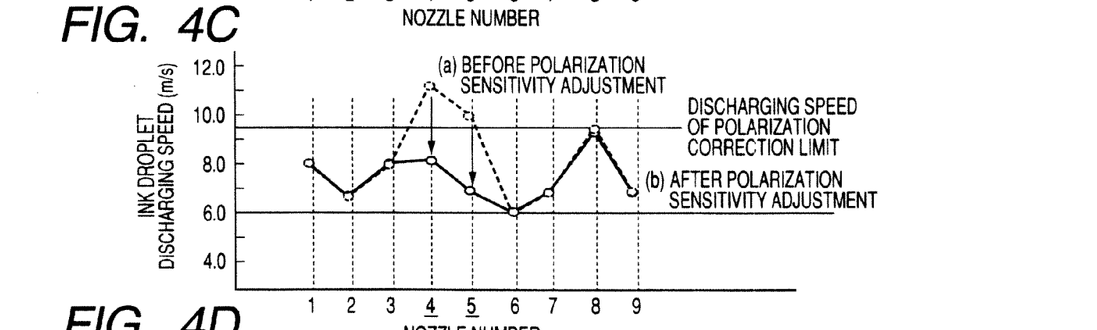

In particular, a predetermined droplet discharging speed is set as a droplet discharging speed of the polarization correction limit. For example, as shown in FIG. 4(C), 9.6 m/s is set as the droplet discharging speed of the polarization correction limit. A nozzle having a speed higher than the droplet discharging speed of the polarization correction limit is extracted. In this example, the 4th and 5th nozzles correspond to the nozzles having the speeds higher than the droplet discharging speed of the polarization correction limit. Then, polarization sensitivity correcting pulses (voltages) for reducing the polarization sensitivity is applied to the extracted nozzles by the polarization sensitivity adjusting pulse generating circuit 303.

Accordingly, the polarization sensitivities of the piezoelectric elements 130 corresponding to the 4th and 5th nozzles having the droplet discharging speed exceeding the droplet discharging speed of the polarization correction limit of 9.6 m/s are reduced. Then, as represented by graph (b) shown in FIG. 4C, the polarization sensitivities of the piezoelectric elements 130 of the 4th and 5th nozzles are reduced such that the droplet discharging speed does not exceed the droplet discharging speed of the polarization correction limit even in a case where a polarization process is performed with the highest allowed polarization voltage. The voltage values of the polarization sensitivity adjusting pulse for reducing the polarization sensitivity are determined by the polarization sensitivity adjusting value calculating section 301 and are applied to the 4th and 5th nozzles selected by the polarization sensitivity adjusting nozzle selecting signal generating circuit 302.

Figure 4D:
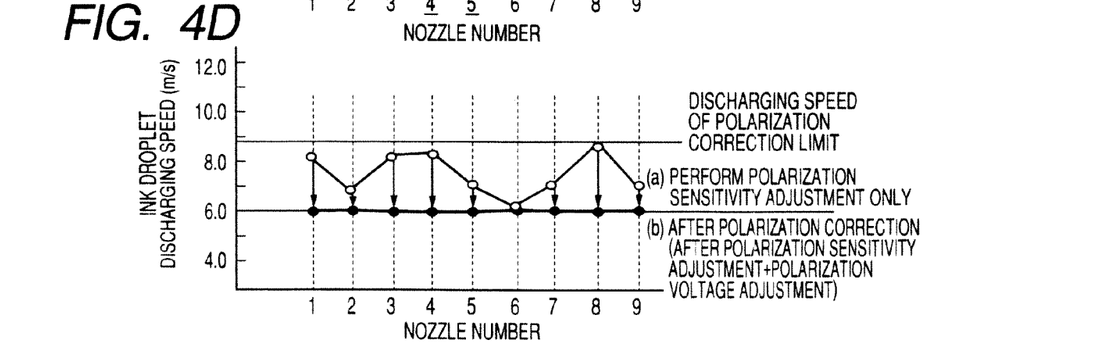

Next, in the polarization-voltage application adjusting process, all the nozzles are depolarized, and then the polarization voltage that enables each nozzle to have the droplet discharging speed of 6 m/s is calculated by the polarization voltage calculating section 305. Then, the polarization pulses having voltage values on the basis of the calculated result are generated by the polarization pulse generating circuit 307, and are applied to the piezoelectric elements 130. Then, as shown in FIG. 4D, the droplet discharging speed of each nozzle is set around 6 m/s, and a polarization correcting process is performed such that non-uniformity of the droplet discharging speeds decreases.

Letters Y and N and numbers 62, 77, . . . , 60, 73 that are written on the right side of each piezoelectric element 130 of the print head 10 shown in FIG. 1 denote, in the above-described polarization correcting process according to an embodiment of the present invention, whether a polarization sensitivity adjusting pulse is applied (Y or N) to each nozzle and voltage values of the polarization pulses. As can be known from FIG. 1, although the 4th and 5th nozzles have high droplet discharging speeds, polarization voltages thereof are set to be higher than that of the 8th nozzle having a droplet discharging speed lower than those of the 4th and 5th nozzles. This is because the polarization sensitivities of the 4th and 5th nozzles are adjusted and set to be low.

After the correction process is performed by applying the polarization pulses, the piezoelectric elements 130 corresponding to the nozzles are driven to perform aging as a post-process. Accordingly, the polarization state can stably suppress a variation in the droplet discharging characteristic currently in use.

Next, the principle of polarization correction according to the present invention will be described in detail for the 2nd to 8th nozzles as an example with reference to FIG. 5.

Figure 5:
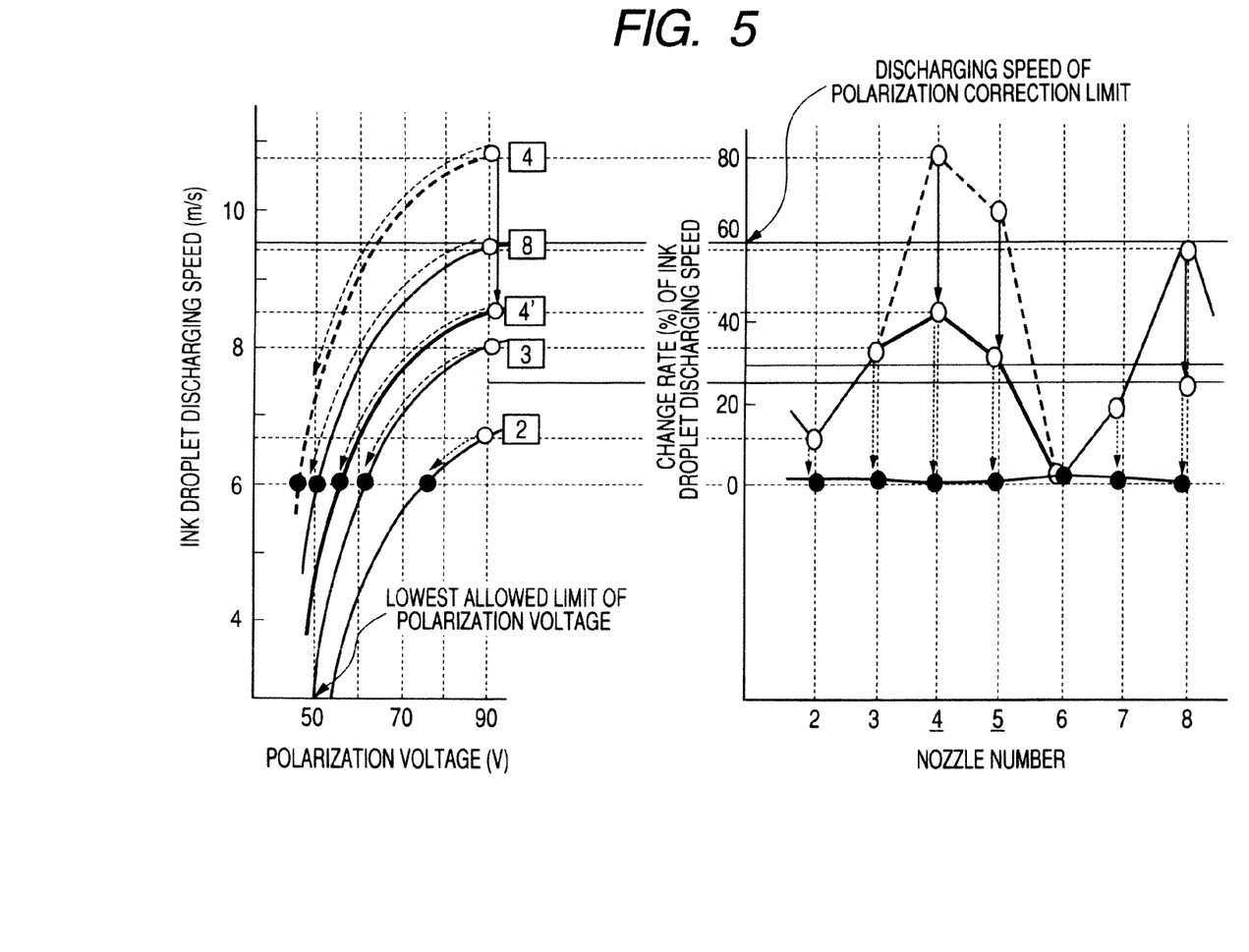
FIG. 5 is a diagram showing the principle of the polarization correcting operation in detail.

The graphs shown in right section in FIG. 5 are the same as the above-described graphs of the droplet discharging speed non-uniformity for the 2nd to 8th nozzles shown in FIGS. 4C and 4D. The graphs shown in left section in FIG. 5 represent the polarization sensitivity characteristics of each nozzle by taking the horizontal axis as a polarization voltage value and the vertical axis as the ink droplet discharging speed. Boxed numbers 4, 8, 4', 3, and 2 show polarization sensitivity characteristic curves for the 4th and 8th nozzles before the correction of the polarization sensitivity and for the 4th, 3rd, and 2nd nozzles after the correction of the polarization sensitivity. In addition, the droplet discharging speed for each nozzle before the correction is set to a speed at a time when the nozzle is polarized with a maximum polarization voltage of 90 V.

The 2nd nozzle has the polarization sensitivity characteristic of a curve denoted by boxed number 2. Accordingly, when the 2nd nozzle is repolarized at about 77 V, the droplet discharging speed thereof can be corrected to about 6 m/s that is the target speed. Similarly, the 3rd nozzle can be corrected with a polarization voltage value of 62 V. ON the other hand, in order to correct the 4th nozzle to have the target speed of 6 m/s in this state, the polarization voltage is needed to be adjusted and set below the lowest allowed limit of the polarization voltage of 50 V. ON the other hand, when each one of the piezoelectric elements 130 used in this embodiment is repolarized with a polarization voltage value equal to or smaller than 50 V, the polarization voltage thereof becomes too low, and the usable endurance for a driving operation on the basis of the droplet-discharge driving pulse signal in a record process is insufficient, and thereby the speed value changes from the corrected speed value. By precisely setting the 8th nozzle to have a 50V that is the lowest allowed limit of the polarization voltage based on the curve of the polarization sensitivity characteristic, it is possible to set the 8th nozzle to have the target speed of 6 m.

Accordingly, the droplet discharging speed of 9.6 m/s of the 8th nozzle at the polarization voltage of 90 V becomes 9.6 m/s. In other words, a speed that has a speed change rate increased by 60% from the speed of 6 m/s becomes the droplet discharging speed of the polarization correction limit. In addition, as shown in FIG. 5, the droplet discharging speed of the 5th nozzle, similarly to that of the 4th nozzle, exceeds the droplet discharging speed of the polarization correction limit, and the polarization voltage value equal to or larger than the lowest allowed limit of the polarization voltage of 50 V cannot be set for the 5th nozzle by only correcting the polarization voltage.

Thus, a nozzle having a droplet discharging speed exceeding the droplet discharging speed of the polarization correction limit is extracted, and a polarization sensitivity adjusting pulse (voltage) is applied to the piezoelectric element of the nozzle so as to decrease the polarization sensitivity. As a result, for example, the polarization characteristic curve of the piezoelectric element of the 4th nozzle is adjusted and set as a polarization characteristic curve 4'. Accordingly, the droplet discharging speed corresponding to the polarization voltage value of 90 V can be set to be equal to or smaller than the droplet discharging speed of the polarization correction limit. The polarization voltage value for correcting the piezoelectric element after the polarization sensitivity adjustment and setting to have the droplet discharge speed of 6 m/s is 55 V. Accordingly, the polarization voltage higher than the lowest allowed limit of the polarization voltage value of 50 V can be set, and thereby the durability can be acquired. Similarly, for the 5th nozzle, by performing a repolarization process after the polarization sensitivity is adjusted and set, the durability is acquired, and a correction process can be performed.

Here, by applying a polarization sensitivity adjusting pulse having a same voltage value and a same waveform to the 4th and 5th nozzles, the polarization sensitivity is decreased. However, the setting of the polarization sensitivity adjusting pulse may be changed in accordance with the droplet discharging speed of each nozzle. In other words, for a nozzle exceeding the droplet discharging speed of the polarization correction limit much, the polarization sensitivity may be adjusted to be decreased much by increasing the voltage value of the polarization sensitivity adjusting pulse or increasing the number of applied pulses. Accordingly, the range of non-uniformity of the droplet discharging speeds among the nozzles of the head before the polarization correction which can be corrected according to the present invention can be increased further.

In addition, the states of switching elements 180s connected to the piezoelectric elements corresponding to a same group of nozzles are turned ON by dividing nozzles that exceed the droplet discharging speed of the polarization correction limit into groups based on the amounts of excess and generating the polarization sensitivity adjusting pulses to be constant for each group, and the polarization sensitivity adjustment for the piezoelectric elements is performed approximately at the same time by applying the polarization sensitivity adjusting pulses. Accordingly, a time required for the process of the polarization sensitivity adjustment is saved, and thereby the productivity can be improved.

In addition, in the polarization-voltage application adjusting process, so-called a sequential polarization method in which polarization correction for one nozzle is completed until the nozzle reaches a target droplet discharging speed by performing a plurality of processes and the polarization correction for the next nozzle is performed may be used. In addition, a parallel polarization correcting method in which the polarization correcting process for correcting the degree of polarization is performed in parallel for all the nozzles to be corrected may be used, and the present invention is not limited to the above-described method for polarization-voltage application adjusting process.

As described above, for a plurality of piezoelectric elements, a repolarization process for maintaining the non-uniformity of the droplet discharging characteristics of each nozzle to be within the allowed range is performed by combining a polarization sensitivity adjustment and the polarization voltage adjustment. Accordingly, even for a head having high non-uniformity of the droplet discharging characteristics, a polarization process using a polarization voltage for which the adjustment of the degree of polarization can be performed without failure by a droplet-discharge driving operation, and thereby the non-uniformity of the droplet discharging characteristic can be decreased. In addition, the number of heads that can be polarized can be increased, and thereby a manufacturing process yield is improved. In addition, the allowed range of the precision of components or assembly can be expanded, and thereby the manufacturing cost of the head can be reduced.

In such a case, as described as above, a low polarization voltage can be prevented by performing the adjustment of the polarization sensitivity for a required piezoelectric element from among the plurality of the piezoelectric elements and then performing polarization voltage adjustment for the plurality of the piezoelectric elements. In addition, simplification of the polarization process can be achieved by setting a same value of the adjustment amount of the polarization sensitivity for each piezoelectric element corresponding to two or more nozzles having close droplet discharging characteristics and then performing the adjustment of the polarization sensitivity. In addition, the polarization sensitivity can be adjusted in a simple manner by performing the polarization sensitivity adjustment by applying polarization sensitivity adjusting voltages to the piezoelectric elements.

In addition, by using a configuration in which a repolarization process configured by combining the adjustment of the polarization sensitivity and the adjustment of the polarization voltage is performed for the plurality of the piezoelectric elements and the non-uniformity of the droplet discharging characteristics of each nozzle is maintained within a predetermined allowed range, the polarization process is performed using a polarization voltage for which the adjustment of the degree of polarization is not failed by the droplet-discharge driving, and accordingly, the usable endurance is improved, and droplet discharge with a low degree of non-uniformity of the droplet discharging characteristics can be performed in a stable manner.

Accordingly, an image forming apparatus such as an inkjet recording apparatus having the above-described liquid discharging head can stably perform droplet discharge with low non-uniformity of the droplet discharging characteristics. In addition, the image forming apparatus can record a high-quality image in a stable manner.

Next, another embodiment of the present invention will be described with reference to FIGS. 6A and 6B.

In the above-described embodiment, the correction of the droplet discharging speed as the correction of the droplet discharging characteristic has been described as an example. However, in this embodiment, similarly, correction of non-uniformity of droplet discharging masses among the nozzles, in which the droplet discharging speed is replaced with a droplet discharging mass, is additionally performed.

Figure 6A:
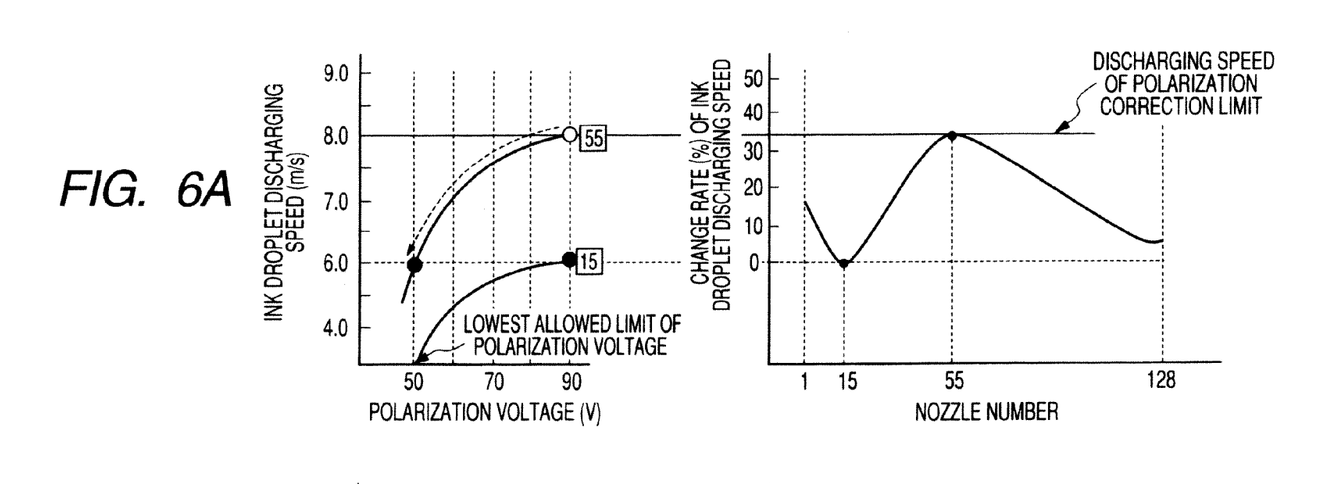
FIGS. 6A and 6B are diagrams showing another embodiment of the present invention.

A graph shown in left section in FIG. 6A shows an example of the characteristic of the droplet discharging speeds of the 1st to 128th nozzles of a print head having 128 nozzles. In the print head, the droplet discharging speed of the 15th nozzle is the slowest, and the droplet discharging speed of the 55th nozzle is the fastest. In addition, the range of non-uniformity of the droplet discharging speed is about 35% with reference to the 15th nozzle having the slowest speed of 6 m/s. The droplet discharging speed is non-uniform in the above-described range.

Graphs shown in left section in FIG. 6A represent polarization sensitivity characteristic curves of the 15th nozzle and the 55th nozzle by taking the horizontal axis as a polarization voltage value and the vertical axis as an ink droplet discharging speed (the curves are identified by the boxed numbers 15 and 55, as described above). The 15th nozzle has a droplet discharging speed of 6 m/s at the polarization voltage of 90 V, and can be corrected to have the target speed of 6 m/s by adjusting and setting the polarization voltage for the 55th nozzle to the lowest allowed limit of the polarization voltage of 50 V. The entire nozzles of the 1st to 128th nozzles can be corrected to have the droplet discharging speed (within the range of the allowed range of the droplet discharging speed) of 6 m/s by only performing the polarization voltage correction.

Figure 6B:
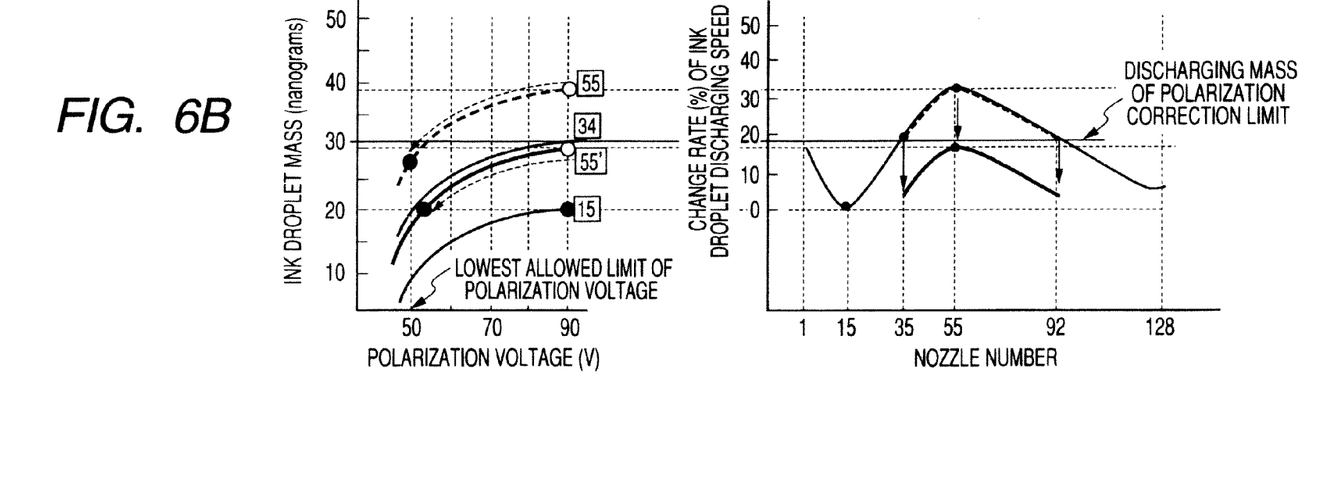

On the other hand, a graph shown in right section in FIG. 6B represents a droplet discharge mass (may be simply referred to as a droplet mass) characteristic of the 1st to 128th nozzles of the print head. The 15th nozzle has the smallest droplet discharge mass, and the 55th nozzle has the largest droplet mass. The range of non-uniformity of the weights is 32% with reference to the 15th nozzle having the smallest mass of 20 nanograms, and the weights are non-uniform in the range.

Graphs shown in left section in FIG. 6B represent polarization sensitivity mass characteristic curves of the 15th nozzle, the 34th nozzle, and the 55th nozzle by taking the horizontal axis as a polarization voltage value and the vertical axis as an ink droplet mass. The 15th nozzle has a droplet mass of 20 nanograms at the polarization voltage of 90 V, and the 55th nozzle has a droplet mass of 38 nanograms at 90 V. As can be known from the polarization sensitivity mass characteristic curve of the 55th nozzle, the droplet mass of the 55th nozzle decreases only to 30 nanograms even in a case where the polarization voltage is corrected to the lowest allowed limit of the polarization voltage of 50 V. Accordingly, it can be known that, in order to correct the droplet mass of the 55th nozzle to the target droplet mass of 20 nanograms, the polarization voltage is quite below the lowest allowed limit of the polarization voltage of 50 V.

As described above, the width of adjustable masses by adjusting the polarization voltage is considerably smaller than that of the adjustable droplet discharging speeds. While the width of speed adjustment according to adjustment of the polarization voltage of 50 V to 90 V, as shown in left section in FIG. 6A, is about 35%, the width of the mass adjustment is only about 18%. Accordingly, although the 1st to 34th nozzles and the 93rd to 128th nozzles can be adjusted to around 20 nanograms by adjusting the polarization voltages, the 35th to 92nd nozzles cannot be sufficiently corrected to the target value.

Thus, by applying the present invention, the polarization sensitivity characteristics of the 35th to 92nd nozzles are decreased by applying the polarization sensitivity adjusting pulses (voltages) to the piezoelectric elements thereof. Accordingly, the droplet discharge mass can be set to a value equal to or smaller than the polarization correction limit of the droplet discharge mass. Accordingly, the non-uniformity of masses among the 35th to 92nd nozzles can be adjusted and set as denoted by a thick solid line shown in right section in FIG. 6B, and can be suppressed to be within 18%.

Accordingly, the polarization sensitivity mass characteristic curve of the 55th nozzle that has the largest droplet discharge mass before correction changes from the characteristic denoted by attached number 55 to the right section in FIG. 6B to the characteristic denoted by attaching number 55'.

Subsequently, by adjusting the polarization voltage to 53 V, it is possible to correct the droplet mass to around the target droplet mass of 20 nanograms. Any other nozzle among the 35th to 92nd nozzles can be corrected to have the droplet mass of 20 nanograms by adjusting the polarization voltage by using the same correction process for decreasing sensitivity.

Accordingly, the entire nozzles can be corrected to have the droplet mass around the target droplet mass of 20 nanograms (within the allowed range).

As described above, droplet discharge mass correction to which a general polarization voltage correcting method cannot sufficiently respond can be responded, and accordingly, the non-uniformity of droplet discharge masses among the nozzles can be reduced. In addition, it is possible to appropriately set both the correction of the ink droplet discharge mass and the correction of the ink droplet discharging speed in accordance with its use.

Next, still another embodiment of the present invention will be described with reference to FIG. 7.

In this embodiment, in order to increase the margin of usable endurance of the print head, the polarization correcting voltage is set to be slightly higher. In other words, the example shown in FIG. 7 corresponds to FIG. 5 of the above-described embodiment. The difference from the above-described embodiment is that the non-uniformity of droplet discharge speeds after the polarization sensitivity adjustment is suppressed to be low and correction in a polarization voltage region higher than 65 to 90 V can be made, by increasing the number of nozzles for which the polarization sensitivities are decreased.

In other words, in the example shown in FIG. 5, for the 2nd to 8th nozzles, the 4th and 5th nozzles that have droplet discharging speeds exceeding the droplet discharging speed of the polarization correction limit that is higher than 6 m/s, which is used as a reference, by 60% are extracted. Then, the droplet discharging speeds are decreased by about 40% by decreasing the polarization sensitivities of the piezoelectric elements of the 4th and 5th nozzles. Accordingly, although the 8th nozzle has a droplet discharge speed close to the droplet discharging speed of the polarization correction limit, the polarization sensitivity thereof is not decreased, and the correction for the droplet discharging speed of 6 m/s is performed by only adjusting the polarization voltage. Therefore, the polarization voltage for the 8th nozzle needs to be adjusted and set to 50 V.

Figure 7:
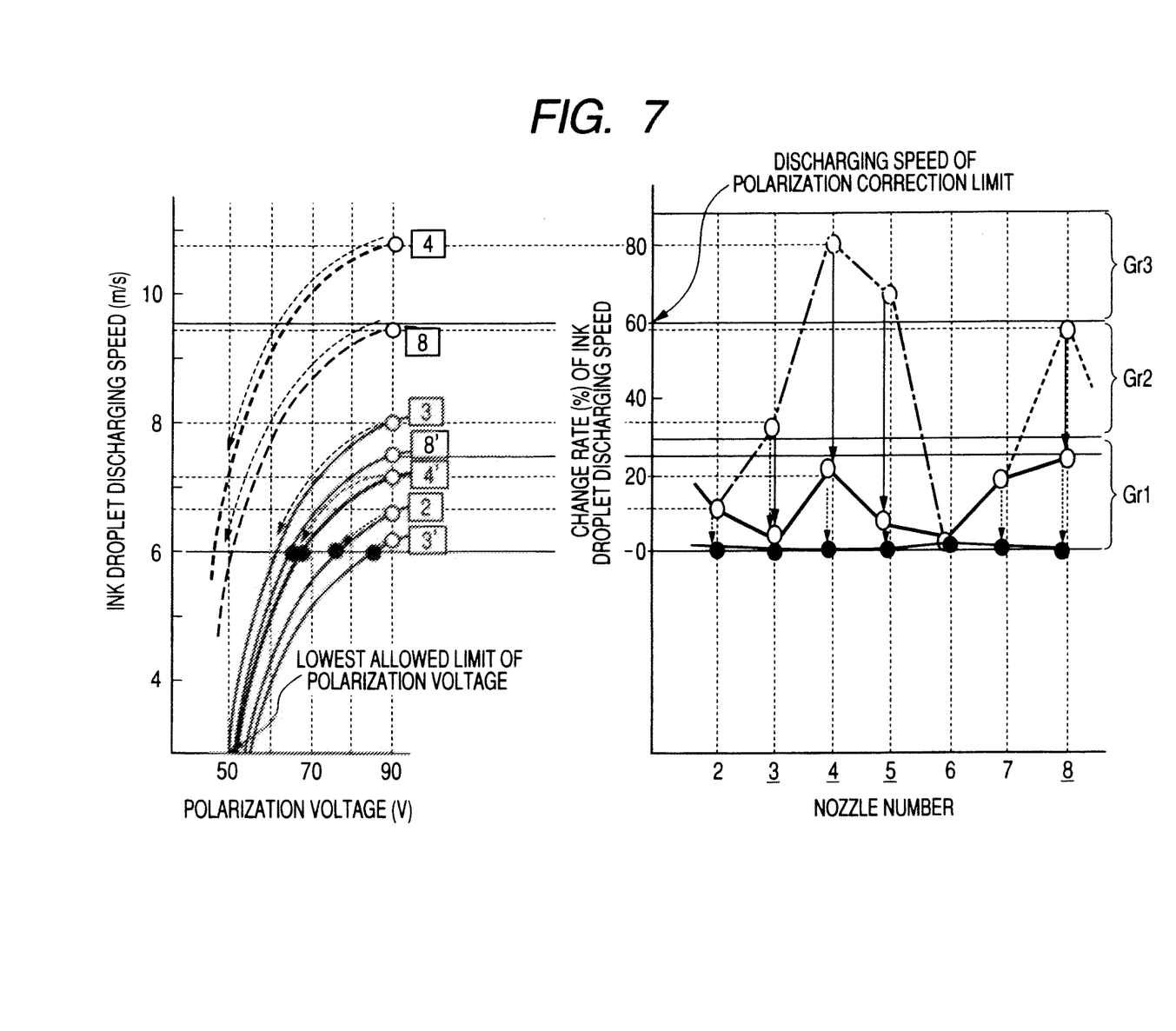
FIG. 7 is a diagram showing still another embodiment of the present invention.

On the contrary, in the example shown in FIG. 7, the 2nd to 8th nozzles are divided into three groups of Gr1, Gr2, and Gr3 based on the droplet discharging speeds. Then, even in a speed zone having the droplet discharging speed equal to or smaller than the polarization correction limit drop discharging speed, the polarization sensitivity is configured to be decreased as the group of Gr2. In other words, nozzles belonging to the group Gr1 have the droplet discharging speedup to a value higher than the target speed of 6 m/s by about 30%. The 2nd, 6th, and 7th nozzles belong to the group Gr1, and polarization-sensitivity reduction adjustment is not performed for these nozzles. On the other hand, nozzles belonging to the group Gr2 have the droplet discharging speed higher than the target speed by about 30% to 60%, and the 3rd and 8th nozzles belong to the group Gr2. For these nozzles, sensitivity adjustment for decreasing the speed by about 1.8 m/s is performed. In addition, nozzles belonging to the group Gr3 have the droplet discharging speed higher than the target speed by about 60% to 90%, and the 4th and 5th nozzles belong to this group. For these nozzles, polarization sensitivity adjustment is performed so as to decrease the speed by about 3.6 m/s.

Accordingly, the droplet discharging speeds of the entire nozzles after the polarization sensitivity reduction adjustment is within the droplet discharging speed zone of the group Gr1, that is, a speed zone having a speedup to a value higher than the target speed by about 30%. For example, the polarization sensitivity characteristic curve of the 4th nozzle which is farther from the target speed becomes a characteristic denoted by boxed number 4', and the correction voltage value for the polarization voltage is about 68 V. In addition, the polarization sensitivity characteristic curve of the 8th nozzle that has the droplet discharging speed positioned in the upper limit of the group Gr2 becomes a characteristic denoted by boxed number 8', and the correction voltage value for the polarization voltage is about 65 V. The polarization sensitivity characteristic curve of the 3rd nozzle that has the droplet discharging speed positioned in the lower limit of the group Gr2 becomes a characteristic denoted by boxed number 3', and the correction voltage value for the polarization voltage is about 85 V.

As described above, according to this embodiment, an adjustment setting value for the polarization voltage can be set to a value equal to or larger than 65 V that is higher than 50V, which is set in the above-described embodiment. In addition, the margin of the usable endurance for the droplet-discharge driving signal in a record process is larger than that in a case where the adjustment setting value for the polarization voltage is set to 50 V (the example shown in FIG. 5).

In such a case, the polarization voltage can be set to a higher voltage region as the number of nozzles for which the polarization sensitivity reduction adjustment can be performed increases by increasing the number of the groups and the non-uniformity of the droplet discharging characteristics after the polarization sensitivity adjusting process decreases.

When the polarization correction is performed by setting the polarization voltage to a higher voltage region, the maximum allowed value of the droplet discharging voltage in consideration of the usable endurance increases. In addition, the allowed value of the temperature in the operation environment of the print head can be increased, and accordingly, the margin of the usable endurance can be increased further.

The polarization correcting process for using the polarization sensitivity adjustment and the polarization voltage adjustment together has been described as an example. However, in order to only perform the polarization sensitivity adjustment by setting the polarization voltage to around 90 V, polarization correction can be made in accordance with the droplet discharging characteristic, which corresponds to an extreme case of this embodiment. In particular, when the target characteristic range is wide, this method may be used. ON the other hand, the polarization sensitivity adjustment requires a time for adjustment with precision higher than that of the polarization voltage adjustment. Accordingly, as described above, when the polarization voltage is adjusted after adjusting the polarization sensitivity, by using the both adjustment processes, it is possible to increase the productivity of high-precision heads in a manufacturing process.

In a polarization correcting process of the above-described embodiments, when application of a depolarization signal that is applied to the piezoelectric element for depolarizing the polarization has an effect on the polarization sensitivity characteristic, the conditions of the polarization adjusting signal is set in consideration of the degree of the effect. In addition, the depolarization signal may be additionally used as a polarization sensitivity adjusting signal.

The print head configured as a liquid discharging head according to an embodiment of the present invention is appropriate to a serial scanning-type ink-jet recording apparatus or a line-scanning type ink-jet recording apparatus. In the serial scanning-type ink-jet recording apparatus, an orifice surface of the print head is installed to face the recording medium, and one line is recorded by moving (main scanning) the print head in a direction intersecting the convey direction of the recording medium while discharging ink droplets in accordance with a record signal. Thereafter, the recording medium is moved (sub scanning) by a predetermined amount, and subsequently, the next line of the image is recorded by performing the main scanning operation. The image is recorded by repeating the main scanning operation and the sub scanning operation. ON the other hand, in the line-scanning type ink-jet recording apparatus, a full-line type print head having a nozzle array corresponding to the width of the recording sheet is configured by one or a plurality of short heads, and an image is recorded on the recording medium by discharging ink droplets in accordance with a record signal while conveying the recording medium.

By using an ink-jet recording apparatus having the liquid discharging head according to an embodiment of the present invention as a print head, a high-quality image can be printed at high speed.

In the above-described embodiments, an ink-jet print head for recording on a recording medium using ink, a method of manufacturing the ink-jet print head, and an ink-jet recording apparatus having the print head have been described. However, the present invention is not limited thereto, and, as described above, may be applied to a liquid discharging head for marking or coating a product, a method of manufacturing the liquid discharging head, and an image forming apparatus such as an industrial liquid distributing apparatus having the liquid discharging head.

Figure 8A:
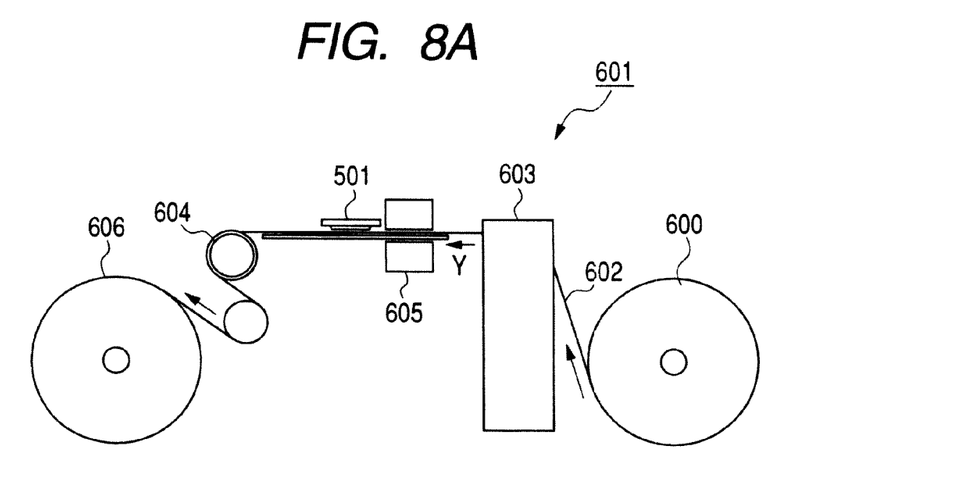
FIGS. 8A and 8B are diagrams that show an example of an image forming apparatus that is provided with the ink-jet print head.
Figure 8B:
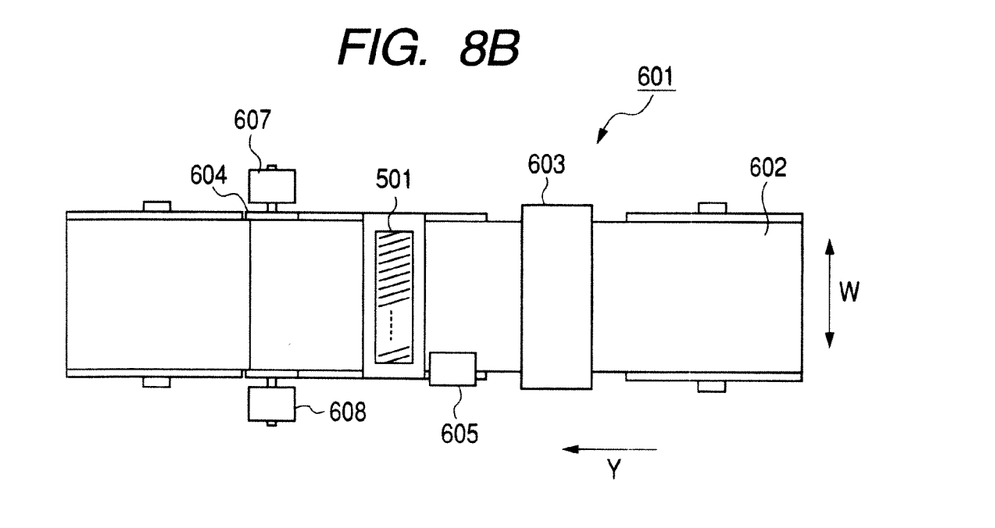

An example of an image forming apparatus that is provided with the ink-jet print head 10 is shown in FIGS. 8A and 8B. As shown in FIGS. 8A and 8B, an image forming apparatus 601 is provided with: a longitudinal print head 501 that includes a plurality of the ink-jet print heads 10 being arranged in a widthwise direction W of a recording sheet; and a sheet conveying apparatus including: a continuous sheet supplying device 600 that supplies a continuous sheet 602; a meander prevention device 603 that prevents meander of the sheet; a speed controlling roller 604 that controls a conveyance speed of the continuous sheet 602; and a sheet receiving device 606 that receives and rolls the conveyed sheet.

The continuous sheet 602 that is supplied by the continuous sheet supplying device 600 is conveyed in a sheet conveyance direction Y to enter the meander prevention device 603. The continuous sheet 602 is output from the meander prevention device 603 and led to a position beneath the longitudinal print head 501 to form an image on the continuous sheet 602. After the image is formed, the continuous sheet 602 is conveyed through the speed controlling roller 604 and rolled by the sheet receiving device 606. The continuous sheet 602 is applied with a moderate tension by the continuous sheet supplying device 600 and the sheet receiving device 606. The conveyance speed is determined by the rotation speed of the speed controlling roller 604.

As shown in FIG. 8B, the sheet conveying apparatus further includes: a sheet edge sensor 605; a conveyance speed control motor 607; and a rotary encoder 608. The edge sensor 605 detects a position of the continuous sheet 602 in the widthwise direction. The sheet edge sensor 605 is attached at a position upstream of the longitudinal print head 501 in the sheet conveyance direction Y, the position corresponding to an edge of the continuous sheet 602. In the example shown in FIGS. 8A and 8B, the sheet edge sensor 605 is configured as a sensor being combined with a laser sensor and a CCD sensor.

The edge sensor 605 outputs a detection signal indicating an edge position of the continuous sheet 602 to the meander prevention device 603. The meander prevention device 603 adjusts meander of the continuous sheet 602 by inclining an internal roller (not shown) based on the detection signal.

The rotary encoder 608 is attached to the speed controlling roller 604 and detects a position of the continuous sheet 602 in the sheet conveyance direction Y. In the example shown in FIGS. 8A and 8B, the rotary encoder 608 is configured as an encoder that optically detects rotation of a disk being formed with slits. The rotary encoder 608 outputs the detected position of the continuous sheet 602 to the conveyance speed controlling motor 607. The conveyance speed controlling motor 607 controls the conveyance speed based on the detected position input from the rotary encoder 608.

What is claimed is:

1. A method for manufacturing a liquid discharging head, the method comprising:
    forming a plurality of nozzles that discharge liquid droplets;
    forming a plurality of piezoelectric elements that generate pressure for discharging liquid droplets from respective nozzles;
    performing a on the piezoelectric elements; and
    after said performing the depolarization, performing a repolarization on the piezoelectric elements to set non-uniformity of droplet discharging characteristics of the nozzles to be in a predetermined range by combining an adjustment of a polarization sensitivity and an adjustment of a polarization voltage for each of the piezoelectric elements.

2. The method according to claim 1, wherein the repolarization is performed by:
    adjusting the polarization sensitivity for a part of the piezoelectric elements selected from among the piezoelectric elements; and
    adjusting, after adjusting the polarization sensitivity, the polarization voltages for the piezoelectric elements.

3. The method according to claim 1, wherein the repolarization is performed by:
    adjusting the polarization sensitivity to set a same amount of adjustment of the polarization sensitivity for piezoelectric elements corresponding to two or more of the nozzles that have similar droplet discharging characteristics.

4. The method according to claim 1, wherein the adjustment of the polarization sensitivity is performed by applying polarization sensitivity adjusting voltages to the piezoelectric elements.

5. The method according to claim 1, wherein the polarization sensitivity and the polarization voltage of one of the piezoelectric elements are different from the polarization sensitivity and the polarization voltage of another one of the piezoelectric elements.

6. The method according to claim 1, wherein a droplet discharging characteristic of one of the piezoelectric elements is different from a droplet discharging characteristic of another one of the piezoelectric elements.

7. The method according to claim 1, wherein the droplet discharging characteristics include a discharge speed of an ink droplet.

8. The method according to claim 1, wherein the droplet discharging characteristics include a mass of an ink droplet.

9. The method according to claim 1, wherein said adjustment of the polarization sensitivity is conducted by an AC waveform pulse.

10. The method according to claim 1, wherein the piezoelectric elements have a rod-shape such that a front end portion of the piezoelectric elements contacts a diaphragm of the liquid discharging head.

11. The method according to claim 1, wherein the adjustment of the polarization sensitivity is performed on a part of the piezoelectric elements having the droplet discharging characteristic of the nozzle which could not be set into the predetermined range if only the adjustment of the polarization voltage is performed, and wherein, after the adjustment of the polarization sensitivity is performed, the adjustment of the polarization voltage is performed on all of the piezoelectric elements such that the droplet discharging characteristics of the nozzles are in the predetermined range.

12. A method for manufacturing a discharging head, the method comprising:

forming a plurality of nozzles that discharge droplets;

forming a plurality of piezoelectric elements that generate pressure for discharging droplets from the nozzles;

performing a depolarization on the piezoelectric elements; and after said performing the depolarization, performing a repolarization on the piezoelectric elements to set nonuniformity of droplet discharging characteristics of the nozzles to be in a predetermined range, wherein a piezoelectric element of the piezoelectric elements includes a polarization sensitivity and a polarization voltage different from a polarization sensitivity and a polarization voltage of another piezoelectric element of the piezoelectric elements.

13. The method according to claim 12, wherein said performing the repolarization comprises:

combining an adjustment of a polarization sensitivity and an adjustment of a polarization voltage for each of the piezoelectric elements.

14. The method according to claim 12, wherein the repolarization comprises:

adjusting the polarization sensitivity for a part of the piezoelectric elements selected from among the piezoelectric elements; and adjusting, after adjusting the polarization sensitivity, the polarization voltages for the piezoelectric elements.

15. The method according to claim 12, wherein said adjustment of the polarization sensitivity is conducted by an AC waveform pulse.

16. The method according to claim 12, wherein the adjustment of the polarization sensitivity is performed on a part of the piezoelectric elements having the droplet discharging characteristic of the nozzle which could not be set into the predetermined range if only the adjustment of the polarization voltage is performed, and wherein, after the adjustment of the polarization sensitivity is performed, the adjustment of the polarization voltage is performed on all of the piezoelectric elements such that the droplet discharging characteristics of the nozzles are in the predetermined range.

* * * * *